く12) United States Patent
Wagoner et al.

(10) Patent No.: US 8,897,014 B2
(45) Date of Patent: Nov. 25, 2014

(54) MECHANICAL LAYOUT FOR HALF-BRIDGE POWER MODULE THAT IS OPTIMIZED FOR LOW INDUCTANCE

(75) Inventors: Robert Gregory Wagoner, Roanoke, VA (US); Allen Michael Ritter, Roanoke, VA (US); Mark Eugene Shepard, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 323 days.

(21) Appl. No.: 13/602,452

(22) Filed: Sep. 4, 2012

(65) Prior Publication Data

US 2014/0062210 A1    Mar. 6, 2014

(51) Int. Cl.
*H05K 7/20* (2006.01)
(52) U.S. Cl.
USPC ........... 361/704; 361/688; 361/707; 361/709; 165/80.3; 257/712; 257/713
(58) Field of Classification Search
None
See application file for complete search history.

(56) References Cited

U.S. PATENT DOCUMENTS

| | | | | |
|---|---|---|---|---|
| 6,236,566 | B1 * | 5/2001 | Regnier et al. | 361/699 |
| 6,987,670 | B2 * | 1/2006 | Ahmed et al. | 361/699 |
| 7,149,088 | B2 | 12/2006 | Lin et al. | |
| 7,279,963 | B2 | 10/2007 | Passe et al. | |
| 7,352,587 | B2 | 4/2008 | Schilling et al. | |
| 7,561,429 | B2 * | 7/2009 | Yahata et al. | 361/715 |
| 7,643,319 | B2 | 1/2010 | Wagoner | |
| 7,656,016 | B2 * | 2/2010 | Yoshimatsu et al. | 257/686 |
| 7,791,889 | B2 * | 9/2010 | Belady et al. | 361/721 |
| 7,872,868 | B2 * | 1/2011 | Yamanaka | 361/709 |
| 7,948,758 | B2 * | 5/2011 | Buhler et al. | 361/702 |
| 2006/0290689 | A1 | 12/2006 | Grant et al. | |

* cited by examiner

*Primary Examiner* — Boris Chervinsky
(74) *Attorney, Agent, or Firm* — Ernest G. Cusick; Hoffman Warnick LLC

(57) ABSTRACT

Disclosed is a mechanical layout for a half-bride power module that is optimized for low inductance. In one embodiment, a first power module and a second power module are mounted on each side of a heat sink. An inductance cancelling bus bar is wrapped around the heat sink, the first power module and the second power module in a loop.

20 Claims, 6 Drawing Sheets

MECHANICAL LAYOUT FOR HALF-BRIDGE POWER MODULE THAT IS OPTIMIZED FOR LOW INDUCTANCE

BACKGROUND OF THE INVENTION

The present invention relates generally to power modules, and more particularly, to a mechanical layout for a half-bridge power module that is optimized for low inductance.

Power modules such as a half-bridge power module can be used in power applications that can include power conversion and/or power supply. A typical half-bridge power module contains two discrete power modules connected to a capacitor bank through bus bars. Each of the two discrete power modules includes fast-switching semiconductor devices that can comprise insulated gate bipolar transistors (IGBTs), metal-oxide-semiconductor field-effect transistors (MOSFETs) or high-speed diodes. The power modules are typically mounted on a heat sink in an attempt to mitigate heat build-up that arises from conduction losses and switching losses associated with the switching semiconductor devices turning on and off. Using these power modules in a half-bridge requires careful attention to the physical location of the modules, as well as special layouts for the bus bars. Otherwise, the inductance associated with the commutating loop formed from the power modules and the capacitor bank plus the inductances of the bus bars between the power modules and the capacitor bank can be too high. High inductance is undesirable and can degrade the overall performance of the half-bridge power module.

BRIEF DESCRIPTION OF THE INVENTION

In one aspect of the present invention, a half-bridge power module is provided. In this aspect of the present invention, the half-bridge power module comprises a heat sink; a first power module mounted on one side of the heat sink; a second power module mounted on another side of the heat sink opposite the side that the first power module mounts thereto; and an inductance cancelling bus bar wrapped around the heat sink, the first power module and the second power module in a loop.

In another aspect of the present invention, a power module having a half-bridge configuration is provided. In this aspect of the present invention, the power module comprises a heat sink; a first IGBT power module mounted on one surface of the heat sink in a first plane that is co-planar to one surface of the heat sink; a second IGBT power module mounted on another surface of the heat sink in a second plane that is co-planar to the another surface of the heat sink, wherein the first plane and the second plane are separated by a thickness of the heat sink; a capacitor bank connected to both the first IGBT power module and the second IGBT power module; and an inductance cancelling bus bar wrapped around the heat sink, the first IGBT power module, and the second power IGBT module.

DETAILED DESCRIPTION OF THE INVENTION

Various embodiments of the present invention are directed to arranging power modules in a half-bridge power module on both sides of a heat sink, with one module on one side of the heat sink, and another module on another side of the heat sink. The half-bridge power module is further arranged with an inductance cancelling bus bar (e.g., a metal sheet) wrapped around the individual power modules and the heat sink in a loop. In one embodiment, ends of the inductance cancelling bus bar are connected on both ends near either a positive or negative side of a capacitor bank coupled to the individual power modules bus bar structures. This layout of having the inductance cancelling bus bar make a closed loop around the power modules and the heat sink provides a low inductance arrangement of the commutating loop formed from the these components. In addition, this layout provides a low inductance arrangement of the bus bars that are used to connect the individual power modules and the capacitor bank. Having the half-bridge power module optimized for low inductance in this manner allows a single layer of bus in this layout to provide a main path for carrying current from the individual power modules to the capacitor bank. As a result, the complexity and cost of the half-bridge power module can be reduced in addition to having lower inductances associated with the layout. In another embodiment, the inductance cancelling bus bar can make a closed loop around the power modules, heat sink and the capacitor bank to also provide a low inductance arrangement of the commutating loop formed from the these components.

Figures 1A, 1B:
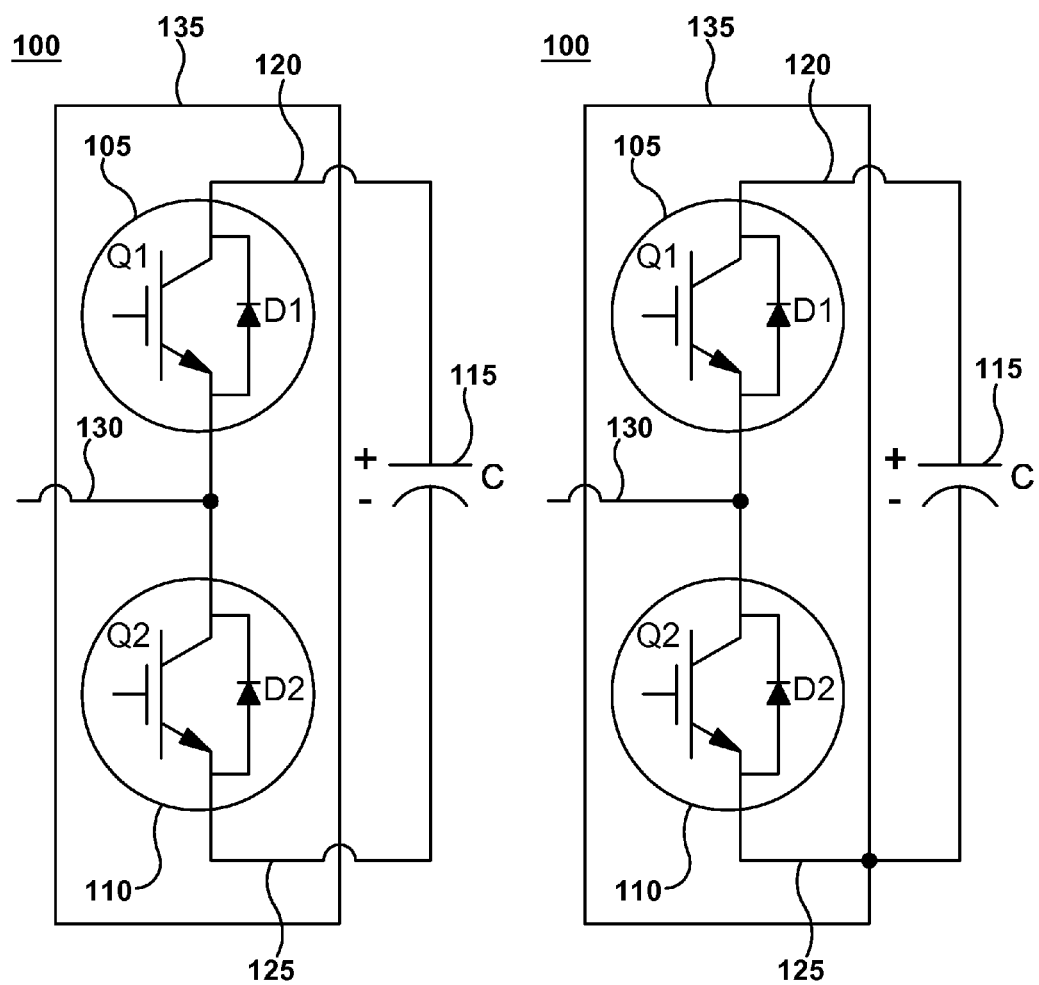
FIGS. 1A-1B show schematic circuit diagrams of a half-bridge power module according to one embodiment of the present invention.

FIGS. 1A-1B show schematic circuit diagrams of a half-bridge power module 100 according to one embodiment of the present invention. As shown in FIGS. 1A-1B, the half-bridge power module 100 comprises an upper power module 105 and a lower power module 110. The designation of upper and lower is relative to a given point of reference, and thus, those skilled in the art will appreciate that power module 110 can be designated as the upper power module, while power module 105 can be designated as the lower power module. In order to obviate limited interpretations of the scope of the various embodiments of the present invention, the following description refers to upper power module 105 as the first power module and lower power module 110 as the second power module.

In one embodiment, first power module 105 and second power module 110 can be insulated gate bipolar transistor (IGBT) modules. Although the description that follows is directed to IGBT modules, the various embodiments of the present invention are not meant to be limited thereto. Those skilled in the art will appreciate that the various embodiments of the present application are applicable to any switching semiconductor devices (e.g., metal-oxide-semiconductor field-effect transistors (MOSFETs), high-speed diodes) that can be deployed within a power module as a half-bridge configuration. As shown in FIGS. 1A-1B, first power module 105 includes a transistor Q1 with a diode D1 connected to the collector and emitter of transistor Q1. Similarly, power module 110 includes a transistor Q2 with a diode D2 connected to the collector and emitter of transistor Q2.

A capacitor bank 115 is electrically connected to first power module 105 and second power module 110. For clarity, FIGS. 1A-1B show capacitor bank 115 with only one capacitor, however, those skilled in the art will appreciate that a capacitor bank would employ more than one capacitor. In one embodiment, capacitor bank 115 can be representative of a DC link capacitor bank.

As shown in FIGS. 1A-1B, a positive DC bus bar 120 electrically connects first power module 105 to a positive terminal of capacitor bank 115. In one embodiment, positive DC bus bar 120 can connect the collector side of transistor Q1 to the positive terminal of capacitor 115. FIGS. 1A-1B further show that a negative DC bus bar 125 electrically connects second power module 110 to a negative terminal of capacitor bank 115. In one embodiment, negative DC bus bar 125 can connect the emitter side of transistor Q2 to the negative terminal of capacitor bank 115. FIGS. 1A-1B also show an AC output bus bar 130 electrically connected to a connection of first power module 105 with second power module 110. In one embodiment, AC output bus bar 130 can be located between positive DC bus bar 120 and negative DC bus bar 125. In particular, AC output bus bar 130 is connected to a node that connects the emitter of transistor Q1 to the collector of transistor Q2.

An inductance cancelling bus bar 135 is wrapped around first power module 105 and second power module 110 in a loop. The loop formed from inductance cancelling bus bar 135 wrapped around first power module 105 and second power module 110 also includes encircling portions of positive DC bus bar 120 and negative DC bus bar 125. In one embodiment, shown in FIGS. 1A-1B, inductance cancelling bus bar 135 can have its ends connected about capacitor bank 115. In this embodiment, the ends of inductance cancelling bus bar 135 would be connected near only one of the terminal sides of capacitor bank 115 and not both. For example, the ends of inductance cancelling bus bar 135 would be connected to each other near only one of a positive DC terminal side of capacitor bank 115 and a negative DC terminal of capacitor bank 115. In one embodiment, inductance cancelling bus bar 135 wraps around first power module 105, second power module 110, and portions of positive DC bus bar 120 and negative DC bus bar 125 without touching any of these components. In this manner, inductance cancelling bus bar 135 will have currents flowing in it that oppose the current in the main path, which reduces the inductance. However, the currents in inductance cancelling bus bar 135 only circulate through the inductance cancelling bus bar.

In one embodiment, as shown in FIG. 1A, inductance cancelling bus bar 135 does not connect with positive DC bus bar 120, negative DC bus bar 125 or AC output bus bar 130. In an alternative embodiment, FIG. 1B shows inductance cancelling bus bar 135 connected to one of positive DC bus bar 120, negative DC bus bar 125 and AC output bus bar 130. In particular, FIG. 1B shows inductance cancelling bus bar 135 connected to negative DC bus bar 125 while unconnected with positive DC bus bar 120 and AC output bus bar 130. This example is illustrative of only one embodiment and those skilled in the art will appreciate that in another embodiment inductance cancelling bus bar 135 can be connected to positive DC bus bar 120 or AC output bus bar 130 while unconnected with the other remaining bus bars.

Figure 2A:
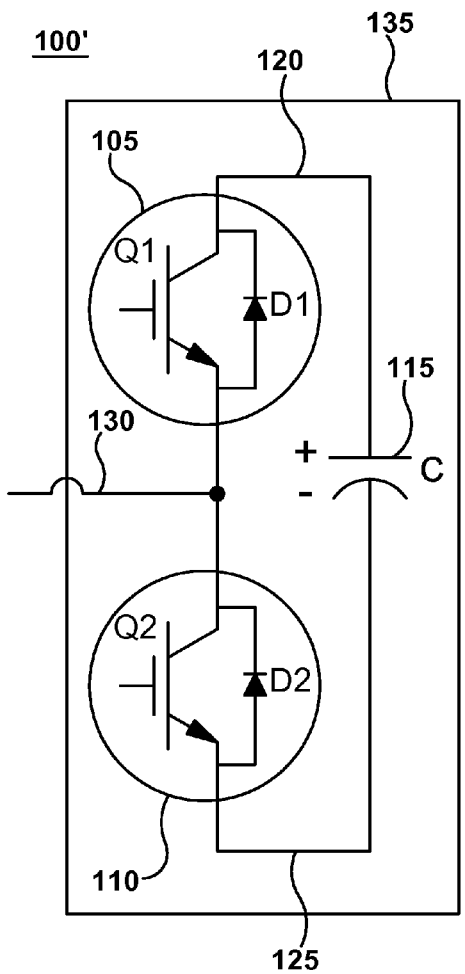
FIGS. 2A-2B show schematic circuit diagrams of a half-bridge power module according to another embodiment of the present invention.
Figure 2B:
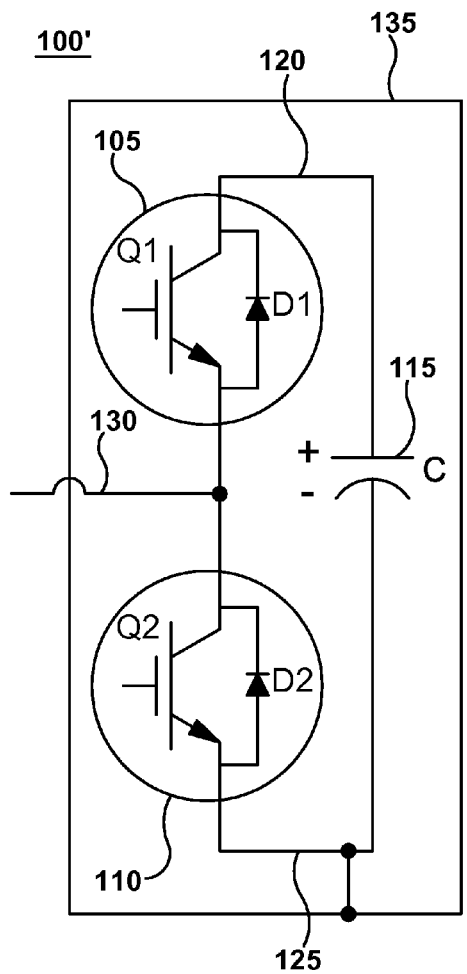

FIGS. 2A-2B show a schematic circuit diagram of a half-bridge power module 100' according to another embodiment of the present invention. In this embodiment, inductance cancelling bus bar 135 is wrapped around first power module 105, second power module 110 and capacitor bank 115 in a loop. The loop formed from inductance cancelling bus bar 135 wrapped around first power module 105, second power module 110, and capacitor bank 115 also includes encircling positive DC bus bar 120 and negative DC bus bar 125. In this embodiment, as in FIGS. 1A-1B, inductance cancelling bus bar 135 can have its ends connected about capacitor bank 115. The ends of inductance cancelling bus bar 135 would be connected near only one of the terminal sides of capacitor bank 115 and not both. For example, the ends of inductance cancelling bus bar 135 would be connected to each other near only one of a positive DC terminal side of capacitor bank 115 and a negative DC terminal of capacitor bank 115. Also, in this embodiment, inductance cancelling bus bar 135 can wrap around first power module 105, second power module 110, capacitor bank 115, positive DC bus bar 120 and negative DC bus bar 125 without touching any of these components. In this manner, inductance cancelling bus bar 135 will have currents flowing in it that oppose the current in the main path, which reduces the inductance.

In one embodiment, as shown in FIG. 2A, inductance cancelling bus bar 135 does not connect with positive DC bus bar 120, negative DC bus bar 125 or AC output bus bar 130. In an alternative embodiment, FIG. 2B shows inductance cancelling bus bar 135 connected to one of positive DC bus bar 120, negative DC bus bar 125 and AC output bus bar 130. In particular, FIG. 2B shows inductance cancelling bus bar 135 connected to negative DC bus bar 125 while unconnected with positive DC bus bar 120 and AC output bus bar 130. Again, this example is illustrative of only one embodiment and those skilled in the art will appreciate that in another embodiment inductance cancelling bus bar 135 can be connected to positive DC bus bar 120 or AC output bus bar 130 while unconnected with the other remaining bus bars.

Figure 3:
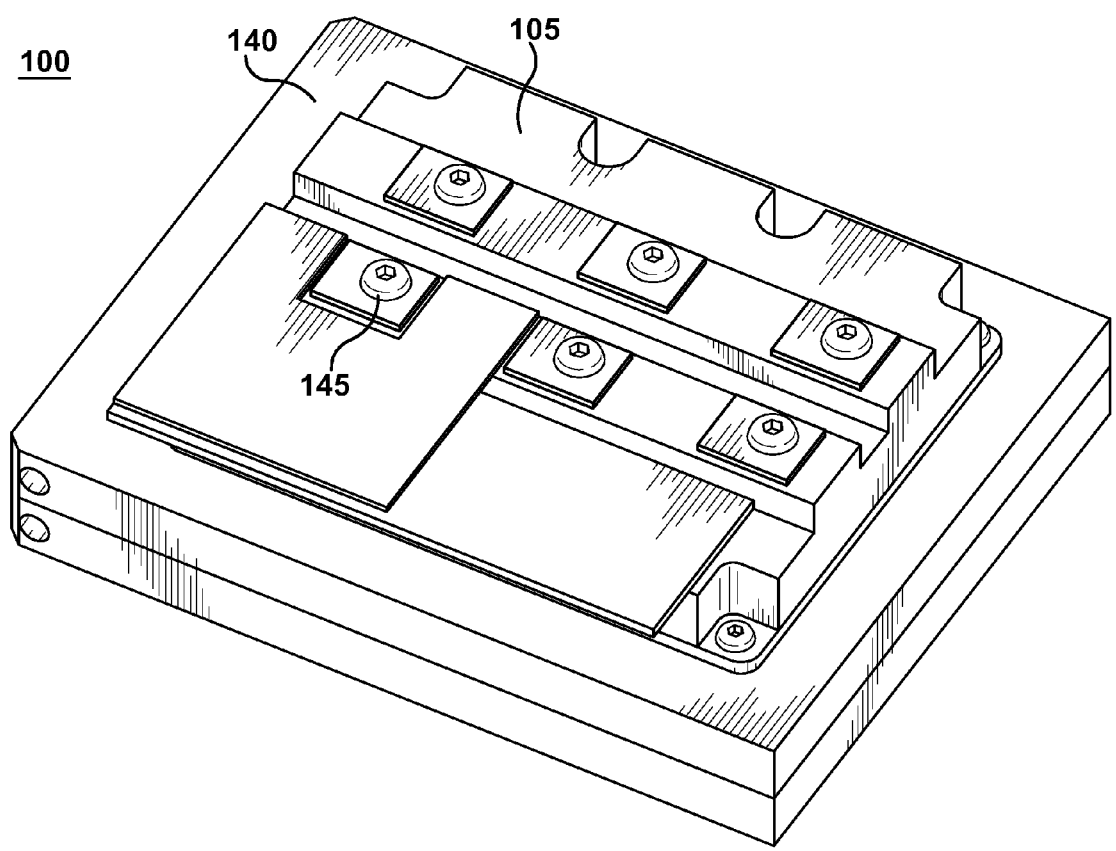
FIG. 3 is a perspective view of a mechanical layout of the half-bridge power module depicted in FIGS. 1A-1B that shows a module of switching devices mounted on one side of a heat sink according to one embodiment of the present invention.

FIGS. 3-6 show perspective views of a mechanical layout for forming the half-bridge power module 100 depicted in FIGS. 1A-1B. As mentioned earlier, power modules are typically mounted on a heat sink in an attempt to mitigate heat build-up that arises from conduction losses and switching losses. FIG. 3 shows first power module 105 mounted on one side of a heat sink 140. Although not shown in FIG. 3, second power module 110 is mounted on an opposing side surface of heat sink 140. In one embodiment, first power module 105 is mounted on one surface of heat sink 140 that is in a first plane that is co-planar to the mounting surface of the heat sink, while second power module 110 is mounted on another surface of heat sink 140 that is in a second plane that is co-planar to the mounting surface of the heat sink. In this embodiment, the first plane and second plane are separated by a thickness of heat sink 140. In contrast to embodiments of the present invention, the discrete power modules of a conventional half-bridge power module are typically mounted in one plane, all on one side of a heat sink, with all components flat in the plane. Such a layout results in less than optimum inductances of the commutating loop formed from the discrete power modules and the capacitor bank.

Both first power module 105 and second power module 110 can be mounted onto their respective side surfaces of heat sink 140 with the use of fasteners 145. In one embodiment, as shown in FIGS. 1A-1B, fasteners 145 can be a screw or bolt. Those skilled in the art will appreciate that fasteners 145 can be any fastener device that mechanically joins or affixes two or more objects together. Therefore, the various embodiments of the present invention are not meant to be limited to the use of a screw or bolt for fasteners 145.

Figure 4:
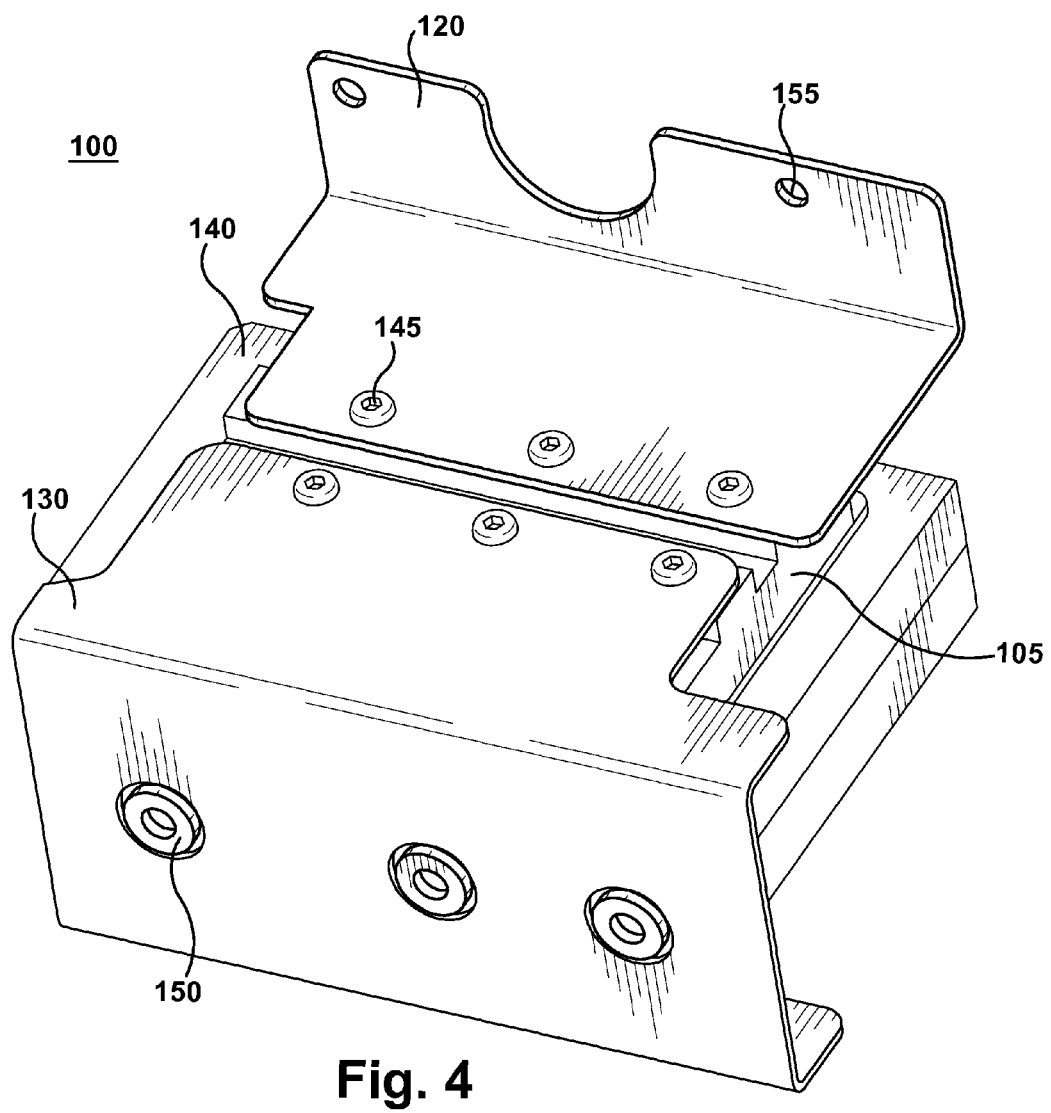
FIG. 4 is a perspective view of a mechanical layout of the half-bridge power module depicted in FIGS. 1A-1B that shows bus bars mounted on the module of switching devices depicted in FIG. 3 according to one embodiment of the present invention.

FIG. 4 is a perspective view of a mechanical layout of the half-bridge power module 100 depicted in FIG. 3, but with bus bars mounted on first power module 105. In particular, FIG. 4 shows positive DC bus bar 120 and AC output bus bar 130 mounted on first power module 105 via fasteners 145. In one embodiment, positive DC bus bar 120 and AC output bus bar 130 are flat, wide sheets of metal such as for example, copper, that is bent about first power module 105 to facilitate a low inductance connection.

FIG. 4 shows that fasteners 150 can fasten AC output bus bar 130 to one surface of heat sink 140. In one embodiment, fasteners 150 fasten AC output bus bar 130 to heat sink 140 at a surface that is adjacent to the mounting surface of first power module 105. In one embodiment, fasteners 150 can be a screw or bolt. Those skilled in the art will appreciate that fasteners 150 can be any fastener device that mechanically joins or affixes two or more objects together. Therefore, the various embodiments of the present invention are not meant to be limited to the use of a screw or bolt for fasteners 150.

FIG. 4 further shows that positive DC bus bar 120 includes holes 155 to facilitate coupling of this bus bar to capacitor bank 115 (not shown in FIG. 4). In this manner, a fastener device can be inserted through holes 155 to secure the connection of positive DC bus bar 120 to capacitor bank 115.

Figure 5:
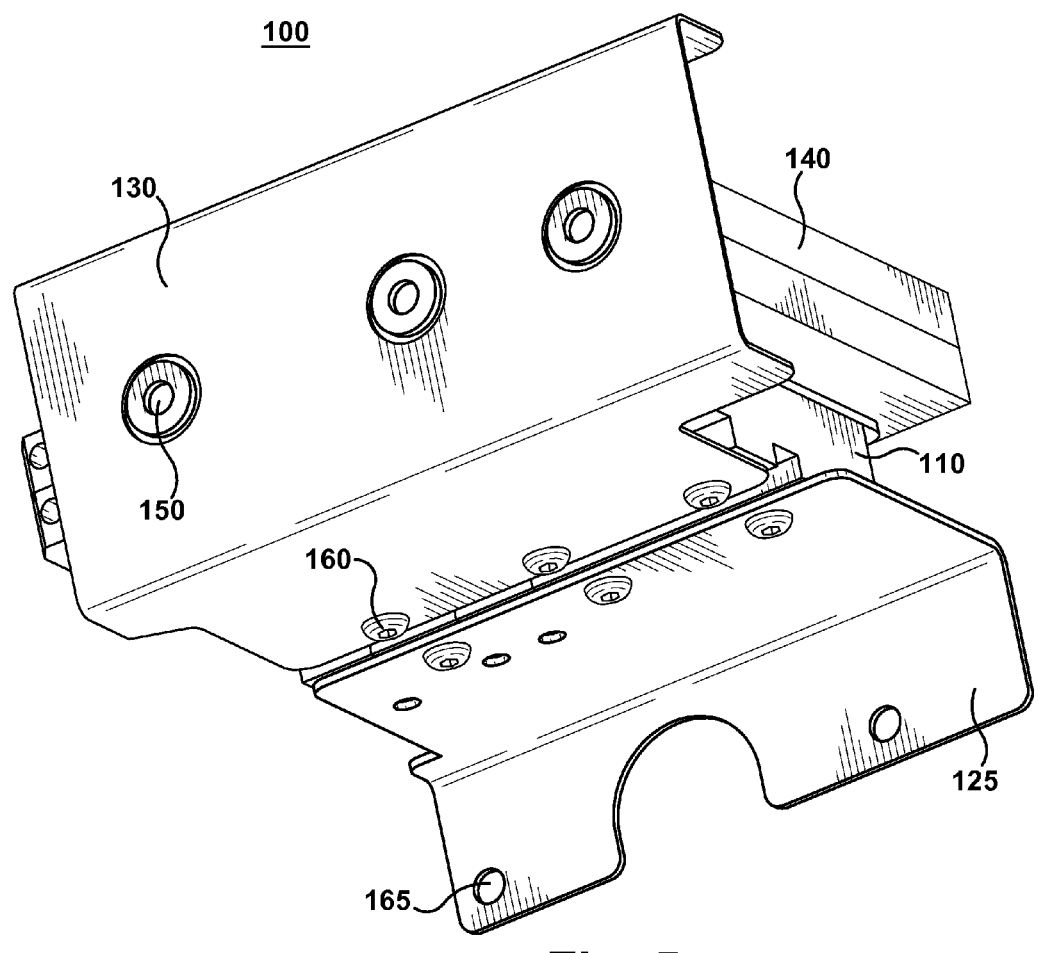
FIG. 5 is a perspective view of a mechanical layout of the half-bridge power module depicted in FIGS. 1A-1B that shows bus bars mounted on another module of switching devices mounted on another side of the heat sink depicted in FIG. 3 according to one embodiment of the present invention.

FIG. 5 is a perspective view of a mechanical layout of the half-bridge power module 100 depicted in FIG. 4, but with negative DC bus bar 125 and AC output bus bar 130 mounted on second power module 110. In particular, FIG. 5 shows second power module 110 mounted onto a surface of heat sink 140 that opposes the mounting surface of first power module 105 (not shown). More specifically, second power module 110 mounts to heat sink via fasteners 160, and negative DC bus bar 125 and AC output bus bar 130 mount to second power module bus bars via the fasteners 160.

Negative DC bus bar 125, like positive DC bus bar 120 and AC output bus bar 130 can be a flat, wide sheet of metal such as for example, copper. Furthermore, negative DC bus bar 125 can be bent to a shape that facilitates a low inductance connection. In addition, negative DC bus bar 125, like positive DC bus bar 120 can include holes 165 to facilitate coupling of negative DC bus bar 125 to capacitor bank 115 (not shown in FIG. 5).

Figure 6:
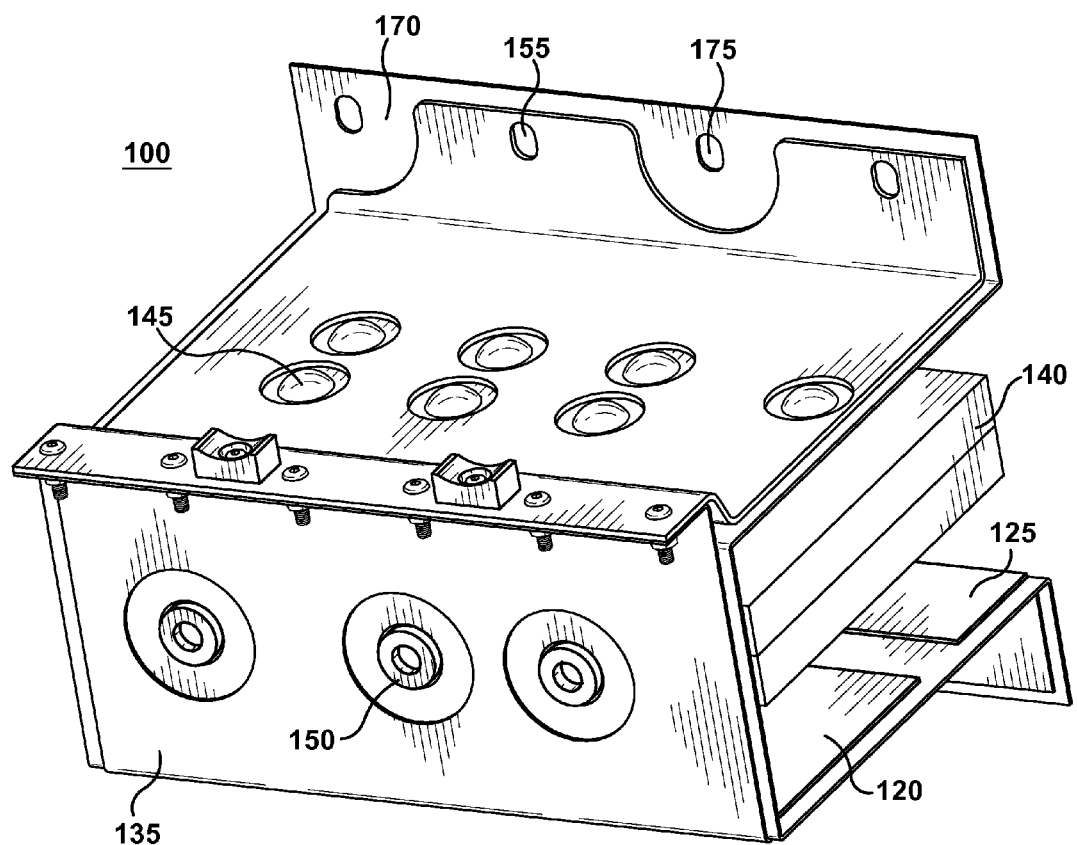
FIG. 6 is a perspective view of a mechanical layout of the half-bridge power module depicted in FIGS. 1A-1B that shows an inductance cancelling bus bar wrapped around the bus bars, the modules of switching devices and the heat sink depicted in FIGS. 3-5 according to one embodiment of the present invention.

FIG. 6 is a perspective view of a mechanical layout of the half-bridge power module 100 depicted in FIGS. 3-5, but with inductance cancelling bus bar 135 wrapped around heat sink 140, positive DC bus bar 120 and negative DC bus bar 125 in a loop. In one embodiment, an insulation layer 170 is disposed between inductance cancelling bus bar 135 and heat sink 140 and the power modules mounted thereto, as well as positive DC bus bar 120 and negative DC bus bar 125. In this manner, insulation layer 170 serves to allow the inductance cancelling bus bar 135 to be tightly coupled close to the main current carrying bus bars (e.g., positive DC bus bar 120, negative DC bus bar 125), which allows the inductance cancelling bus bar 135 to be most effective in its function of reducing the inductance of the main current carrying bus bars.

As shown in FIG. 6, fasteners 145 and 150 secure inductance cancelling bus bar 135 and insulation layer 170 to heat sink 140, first power module 105, second power module 110, positive DC bus bar 120 and negative DC bus bar 125. In particular, fasteners 145 connect the main current carrying bus bars (e.g., positive DC bus bar 120, negative DC bus bar 125) to the power module (i.e., the first power module 105 and second power module 110), while fasteners 150 provide the electrical connections for the node formed from AC output bus bar 130 shown in FIGS. 1A-1B and FIGS. 2A-2B. The tabs with holes 155 provide the means for mechanical support of inductance cancelling bus bar 135. Those skilled in the art will appreciate that other means for mechanical support may be attached at other places not shown.

As shown in FIG. 6, insulation layer 170 can include holes 175 to facilitate a secure connection to capacitor bank 115 (not shown). Like holes 155, a fastener device can be inserted through holes 175 to secure the connection of positive DC bus bar 120 to capacitor bank 115. In this manner, the ends of inductance cancelling bus bar 135 can connect to one of the terminal sides of capacitor bank 115.

The use of inductance cancelling bus bar 135 in the configuration described herein and illustrated with respect to the figures enables half-bridge power module 100 to be optimized to have low inductance. As used herein, low inductance is generally in the range of tens of nano-henries. In one embodiment, the impact of the inductance cancelling bus bar 135 may be to reduce the inductance of the main current carrying bus bars by a factor of 2 or more.

In operation, half-bridge power module 100 will have low inductance because having inductance cancelling bus bar 135 wrapped in a loop around first power module 105 and second power module 110 provides a plate parallel to the bus bars that is of low impedance. This configuration also arises in the embodiment in which inductance cancelling bus bar 135 is wrapped in a loop around first power module 105, second power module 110 and capacitor bank 115 in half-bridge power module 100'. As a result, the electromagnetic field generated about these plates will allow currents to flow in either the bus bars (e.g., positive DC bus bar 120, negative DC bus bar 125) or inductance cancelling bus bar 135 with very low inductance. This is caused by roughly equal and opposite currents that will flow in the inductance cancelling bus bar 135, generated by the electromagnetic field created by the current in the main current carrying bus bars, due to the mutual inductance of the closely coupled conductors. The closer the physical spacing between the inductance cancelling bus bar 135 and the main current carrying bus bars (e.g., positive DC bus bar 120, negative DC bus bar 125), the higher will be the mutual inductance, and this will allow the inductance cancelling bus bar to have a more significant influence on its ability to reduce the inductance of the main current carrying bus bars.

Having lower inductance will allow the switching semiconductor devices that are in power modules 105 and 110 to switch faster and keep within their safe operating limits, resulting in lower switching loss and lower voltage overshoots. This allows the possibility for a performance advantage, ultimately resulting in a lower cost system for a particular power level with added reliability improvement. Another advantage or technical effect of using inductance cancelling bus bar 135 in the configuration described herein and illustrated with respect to the figures, is that a DC bus structure can be cost optimized down to a two-layer structure with minimum complexity. As a result, the complexity and cost of the half-bridge power module can be reduced.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A half-bridge power module, comprising:
   a heat sink;
   a first power module mounted on one side of the heat sink;
   a second power module mounted on another side of the heat sink opposite the side that the first power module mounts thereto; and
   an inductance cancelling bus bar wrapped around the heat sink, the first power module and the second power module in a loop.

2. The half-bridge power module according to claim 1, further comprising a capacitor bank electrically connected to both the first power module and the second power module.

3. The half-bridge power module according to claim 2, wherein the loop formed from the inductance cancelling bus bar wrapped around the heat sink, the first power module and the second power module includes being wrapped around the capacitor bank.

4. The half-bridge power module according to claim 3, wherein ends of the inductance cancelling bus bar are connected to each other near only one of a positive DC terminal side of the capacitor bank and a negative DC terminal of the capacitor bank.

5. The half-bridge power module according to claim 3, wherein the inductance cancelling bus bar is wrapped around the heat sink, the first power module, the second power module and the capacitor bank without touching the heat sink, the first power module, the second power module and the capacitor bank.

6. The half-bridge power module according to claim 2, further comprising a positive DC bus bar that electrically connects the first power module to a positive terminal of the capacitor bank.

7. The half-bridge power module according to claim 6, further comprising a negative DC bus bar that electrically connects the second power module to a negative terminal of the capacitor bank.

8. The half-bridge power module according to claim 7, wherein the inductance cancelling bus bar is configured to have a current flowing therein that opposes current carried by the positive DC bus bar and the negative DC bus bar.

9. The half-bridge power module according to claim 7, further comprising an AC output bus bar electrically connected to a node connecting the first power module with the second power module.

10. The half-bridge power module according to claim 9, wherein the AC output bus bar is located between the positive DC bus bar and the negative DC bus bar.

11. The half-bridge power module according to claim 2, wherein the capacitor bank comprises a DC link capacitor bank.

12. The half-bridge power module according to claim 1, wherein the first power module and the second power module each comprises an insulated gate bipolar transistor (IGBT) module.

13. A power module having a half-bridge configuration, comprising:
    a heat sink;
    a first IGBT power module mounted on one surface of the heat sink in a first plane that is co-planar to one surface of the heat sink;
    a second IGBT power module mounted on another surface of the heat sink in a second plane that is co-planar to the another surface of the heat sink, wherein the first plane and the second plane are separated by a thickness of the heat sink;
    a capacitor bank connected to both the first IGBT power module and the second IGBT power module; and
    an inductance cancelling bus bar wrapped around the heat sink, the first IGBT power module and the second power IGBT module in a loop.

14. The power module according to claim 13, wherein ends of the inductance cancelling bus bar are connected to each other near only one of a positive DC terminal side of the capacitor bank and a negative DC terminal of the capacitor bank.

15. The power module according to claim 13, wherein the inductance cancelling bus bar is wrapped around the heat sink, the first IGBT power module, and the second IGBT power module without touching the heat sink, the first IGBT power module, and the second IGBT power module.

16. The power module according to claim 13, further comprising a positive DC bus bar that connects the first IGBT power module to a positive terminal of the capacitor bank.

17. The power module according to claim 16, further comprising a negative DC bus bar that connects the second IGBT power module to a negative terminal of the capacitor bank.

18. The power module according to claim 17, wherein the inductance cancelling bus bar is configured to have a current flowing therein that opposes current carried by the positive DC bus bar and the negative DC bus bar.

19. The power module according to claim 17, further comprising an AC output bus bar connected to a node connection of the first IGBT power module with the second IGBT power module, wherein the AC output bus bar is located between the positive DC bus bar and the negative DC bus bar.

20. The power module according to claim 13, wherein the loop formed from the inductance cancelling bus bar wrapped around the heat sink, the first power module and the second power module includes being wrapped around the capacitor bank.

* * * * *